(12) United States Patent
Onishi et al.

(10) Patent No.: US 10,170,470 B2
(45) Date of Patent: Jan. 1, 2019

(54) SWITCHING DEVICE

(71) Applicants: TOYOTA JIDOSHA KABUSHIKI KAISHA, Toyota-shi, Aichi (JP); DENSO CORPORATION, Kariya-shi, Aichi (JP)

(72) Inventors: Toru Onishi, Nagoya (JP); Katsuhiro Kutsuki, Nagoya (JP); Yasushi Urakami, Kariya (JP); Yukihiko Watanabe, Nagakute (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/684,057

(22) Filed: Aug. 23, 2017

(65) Prior Publication Data

US 2018/0114789 A1    Apr. 26, 2018

(30) Foreign Application Priority Data

Oct. 20, 2016  (JP) ................................ 2016-205797

(51) Int. Cl.
*H01L 29/78*  (2006.01)
*H01L 29/06*  (2006.01)
(Continued)

(52) U.S. Cl.
CPC ........ *H01L 27/088* (2013.01); *H01L 29/0696* (2013.01); *H01L 29/42364* (2013.01);
(Continued)

(58) Field of Classification Search
CPC ............. H01L 29/7813; H01L 29/1095; H01L 29/7397; H01L 29/4236; H01L 29/0623;
(Continued)

(56) References Cited

U.S. PATENT DOCUMENTS 8,598,652 B2 * 12/2013 Takaya ................ H01L 29/0623
257/331
9,455,261 B1 *  9/2016 Sun ........................ H01L 27/115
(Continued)

FOREIGN PATENT DOCUMENTS

JP          2006-245358 A       9/2006

*Primary Examiner* — Joseph C Nicely
*Assistant Examiner* — David Goodwin
(74) *Attorney, Agent, or Firm* — Oliff PLC

(57) ABSTRACT

A switching device may include a semiconductor substrate; gate trenches; bottom insulating layers covering bottom surfaces of the gate trenches; gate insulating layers covering side surfaces of the gate trenches; and gate electrodes arranged in the gate trenches. The gate insulating layers in a center portion may have a first thickness and a first dielectric constant, and one or more of the gate insulating layers in a peripheral portion may have, within at least a part of the peripheral portion, a second thickness thicker than the first thickness and a second dielectric constant greater than the first dielectric constant. The semiconductor substrate may include a first region being in contact with the gate insulating layers, a body region being in contact with the gate insulating layers under the first region, and a second region being in contact with the gate insulating layers under the body region.

5 Claims, 9 Drawing Sheets

(51) Int. Cl.
   *H01L 27/088*   (2006.01)
   *H01L 29/423*   (2006.01)
   *H01L 29/16*   (2006.01)

(52) U.S. Cl.
   CPC .... *H01L 29/42368* (2013.01); *H01L 29/7813* (2013.01); *H01L 29/0623* (2013.01); *H01L 29/1608* (2013.01)

(58) Field of Classification Search
   CPC ............. H01L 29/0696; H01L 29/7811; H01L 29/0619; H01L 29/42368; H01L 29/66068
   See application file for complete search history.

(56) References Cited

U.S. PATENT DOCUMENTS

| | | | |
|---|---|---|---|
| 9,768,287 B1* | 9/2017 | Soeno | H01L 23/5283 |
| 9,865,728 B2* | 1/2018 | Soeno | H01L 29/7813 |
| 9,954,096 B2* | 4/2018 | Fujiwara | H01L 29/7813 |
| 2009/0230458 A1* | 9/2009 | Ishiduki | H01L 27/11565 257/324 |
| 2010/0013049 A1* | 1/2010 | Tanaka | H01L 21/76816 257/532 |
| 2011/0220991 A1* | 9/2011 | Takaya | H01L 29/0623 257/330 |
| 2012/0211823 A1* | 8/2012 | Lim | H01L 27/11565 257/326 |
| 2012/0287697 A1* | 11/2012 | Hanzawa | G11C 13/0004 365/148 |
| 2013/0328005 A1* | 12/2013 | Shin | H01L 27/2436 257/1 |
| 2013/0328105 A1* | 12/2013 | Matsuura | H01L 29/0696 257/139 |
| 2016/0351680 A1* | 12/2016 | Soeno | H01L 29/66068 |
| 2017/0012121 A1* | 1/2017 | Saito | H01L 21/047 |
| 2017/0025521 A1* | 1/2017 | Nakagawa | H01L 29/7397 |
| 2017/0213907 A1* | 7/2017 | Soeno | H01L 29/7813 |
| 2017/0323958 A1* | 11/2017 | Kuruc | H01L 29/0834 |
| 2018/0026048 A1* | 1/2018 | Tsuji | H01L 27/11582 257/324 |
| 2018/0090612 A1* | 3/2018 | Fujiwara | H01L 29/7813 |

* cited by examiner

SWITCHING DEVICE

TECHNICAL FIELD

Teachings disclosed herein relate to a switching device.

A switching device disclosed in Japanese Patent Application Publication No. 2006-245358 includes a semiconductor substrate in an upper surface of which a plurality of gate trenches is provided. Bottom surfaces of the gate trenches are covered by bottom insulating layers. Side surfaces of the gate trenches are covered by gate insulating layers. Gate electrodes arranged in the gate trenches are isolated from the semiconductor substrate by the bottom insulating layers and the gate insulating layers. The semiconductor substrate includes source regions, a body region, a drift region, and the like. The source regions, the body region, and the drift region are in contact with the gate insulating layers. When a predetermined potential is applied to the gate electrodes, channels are generated in the body region, and the source regions and the drift region are thereby electrically connected.

SUMMARY

The switching device disclosed in Japanese Patent Application Publication No. 2006-245358 is provided with the plurality of gate trenches in the upper surface of the semiconductor substrate. Hereinbelow, a region of the upper surface of the semiconductor substrate where the plurality of gate trenches is provided may be termed a device region. In a structure of Japanese Patent Application Publication No. 2006-245358, in a periphery of the device region, the gate insulating layers are often subjected to a high electric field application. Due to this, there is a problem that a limitation is cast upon a withstanding voltage of the switching device due to the electric field applied to the gate insulating layers in a vicinity of the periphery of the device region.

A switching device disclosed herein may comprise: a semiconductor substrate; a plurality of gate trenches provided in an upper surface of the semiconductor substrate; bottom insulating layers covering bottom surfaces of the gate trenches; gate insulating layers covering side surfaces of the gate trenches; and gate electrodes arranged in the gate trenches and insulated from the semiconductor substrate by the bottom insulating layers and the gate insulating layers. A device region may be a region in the upper surface in which the plurality of the gate trenches is provided. The device region may include a peripheral portion provided at a periphery of the device region and a center portion surrounded by the peripheral portion. The gate insulating layers in the center portion may have a first thickness and a first dielectric constant. One or more of the gate insulating layers in the peripheral portion may have, within at least a part of the outer peripheral portion, a second thickness thicker than the first thickness and a second dielectric constant greater than the first dielectric constant. The semiconductor substrate may comprise: a first region being of a first conductivity type and in contact with the gate insulating layers in the center portion and the peripheral portion; a body region being of a second conductivity type and in contact with the gate insulating layers under the first region in the center portion and the peripheral portion; and a second region being of the first conductivity type and in contact with the gate insulating layers under the body region in the center portion and the peripheral portion.

It should be noted that the "plurality of gate trenches" as above may be separated from each other. Alternatively, two or more of the gate trenches may be connected to each other through other gate trench(es). The "bottom insulating layers" as above may be separated for each gate trench. Further, in a case where the plurality of gate trenches is connected to each other, the "bottom insulating layers" may be connected among the plurality of gate trenches. The "gate insulating layers" as above may be separated for each gate trench. Further, in the case where the plurality of gate trenches is connected to each other, the "gate insulating layers" may be connected among the plurality of gate trenches. The "gate electrodes" as above may be separated from each other. Further, in the case where the plurality of gate trenches is connected to each other, the "gate electrodes" may be connected among the plurality of gate trenches. Further, portions of the "first region" as above that are in contact with the gate insulating layers may be separated from each other, or may be connected to each other. Further, portions of the "body region" as above that are in contact with the gate insulating layers may be separated from each other, or may be connected to each other.

In the above switching device, a thickness (second thickness) of one or more of the gate insulating layers within at least a part of the peripheral portion of the device region is thicker than a thickness (first thickness) of the gate insulating layers in the center portion of the device region. Due to this, an electric field applied to the gate insulating layers is alleviated in the peripheral portion of the device region (more specifically, at least a part thereof). Due to this, a withstanding voltage of the switching device can be improved. Further, generally, channels are less likely to be generated with a thicker gate insulating layer thickness, and thus a gate threshold (minimum potential of the gate electrode required to turn the switching device on) of the switching device becomes higher, and an on-resistance (resistance in a current path during when the switching device is on) of the switching device becomes higher. However, in the switching device as above, the dielectric constant (second dielectric constant) of the one or more of the gate insulating layers within the at least a part of the peripheral portion of the device region (that is, portion with the thicker gate insulating layer) is larger than the dielectric constant (first dielectric constant) of the gate insulating layers in the center portion of the device region. Due to this, values of the gate threshold and the on-resistance in the peripheral portion of the device region can be brought close to values of the gate threshold and the on-resistance in the center portion of the device region. As described above, according to the structure of this switching device, the electric field applied to the gate insulating layers in the peripheral portion of the device region can be alleviated while suppressing increases in the threshold and the on-resistance of the peripheral portion of the device region.

DETAILED DESCRIPTION

Embodiment

Figure 1:
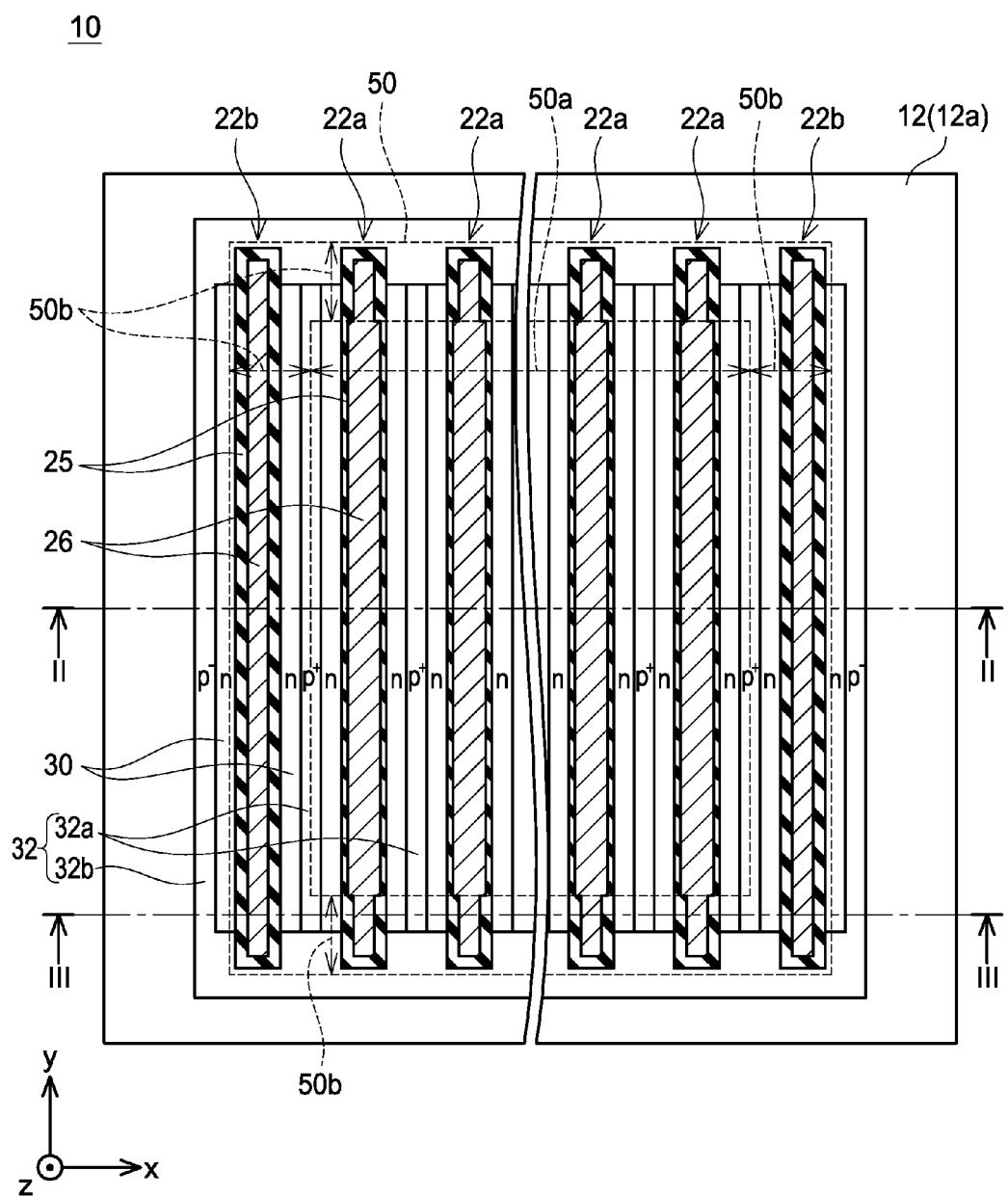
FIG. 1 is a plan view of a MOSFET 10.
Figure 2:
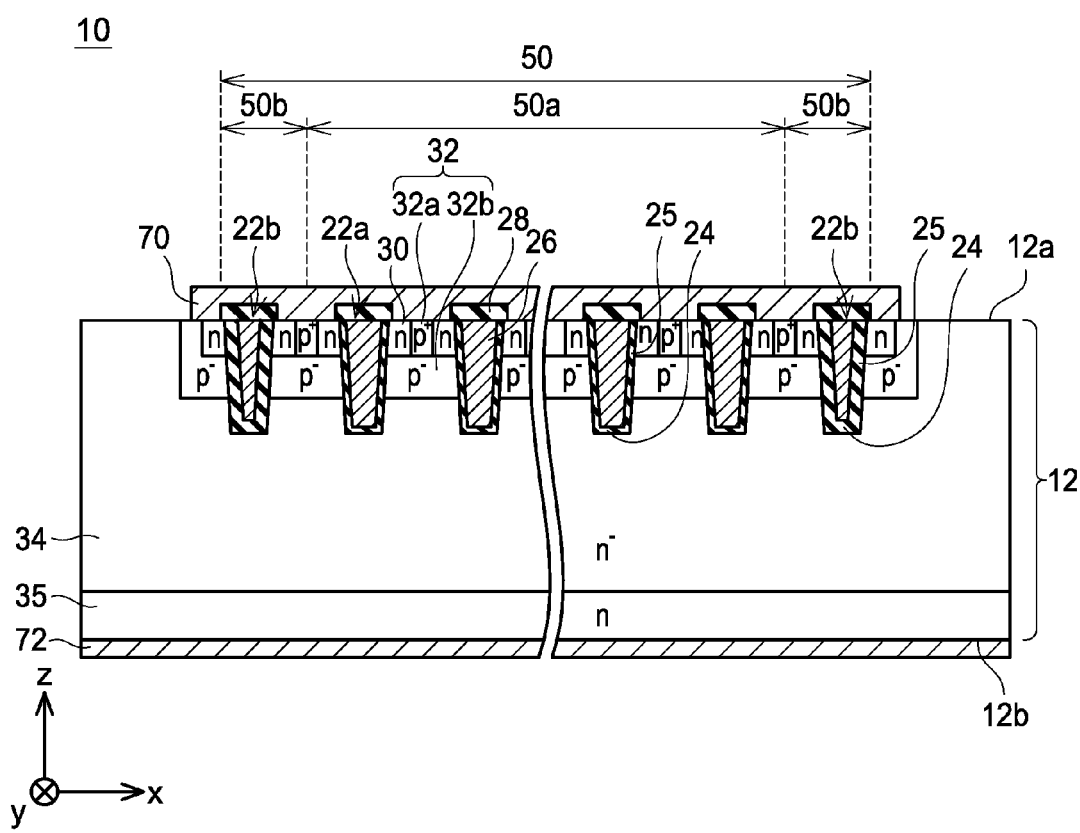
FIG. 2 is a cross sectional view of the MOSFET 10 along a line II-II in FIG. 1.
Figure 3:
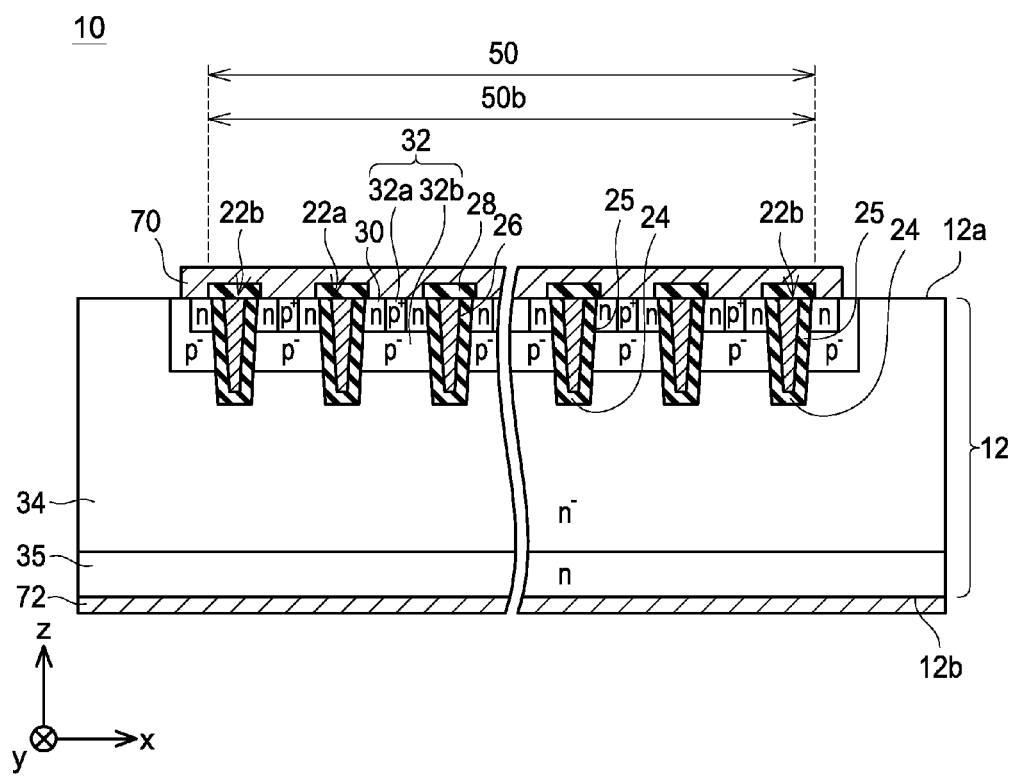
FIG. 3 is a cross sectional view of the MOSFET 10 along a line in FIG. 1.

FIGS. 1 to 3 show a MOSFET 10 (Metal Oxide Semiconductor Field Effect Transistor) of an embodiment. As shown in FIGS. 2 and 3, the MOSFET 10 comprises a semiconductor substrate 12, electrodes, insulating layers, and the like. It should be noted that FIG. 1 and FIGS. 6 to 9 to be described later omit depiction of an electrode and an insulating layer on an upper surface 12a of the semiconductor substrate 12 for the sake of easier understanding. Hereinbelow, one direction parallel to the upper surface 12a of the semiconductor substrate 12 will be termed an x direction, a direction parallel to the upper surface 12a and perpendicular to the x direction will be termed a y direction, and a thickness direction of the semiconductor substrate 12 will be termed a z direction.

The semiconductor substrate 12 is constituted of SiC. As shown in FIG. 1, the upper surface 12a of the semiconductor substrate 12 is provided with pluralities of gate trenches 22a and 22b. Hereinbelow, the gate trenches 22a and the gate trenches 22b may collectively be termed gate trenches 22. Each of the gate trenches 22 extends linearly along the y direction. The plurality of gate trenches 22 is arranged with intervals in between them in the x direction. Hereinbelow, a region where the plurality of gate trenches 22 is provided in the upper surface 12a will be termed a device region 50. Further, a range adjoining a periphery of the device region 50 will be termed a peripheral portion 50b, and a range including a center of the device region 50 and surrounded by the peripheral portion 50b will be termed a center portion 50a. The plurality of gate trenches 22 includes two gate trenches 22b that are arranged on outermost sides along the x direction, and the plurality of gate trenches 22a arranged in a range intervened between the two gate trenches 22b. Entireties of the two gate trenches 22b are arranged within the peripheral portion 50b. Both of longitudinal end portions (end portions along a longitudinal direction) of each gate trench 22a are arranged within the peripheral portion 50b, and a remaining portion of each gate trench 22a is arranged within the center portion 50a. As shown in FIGS. 2 and 3, a bottom insulating layer 24, a gate insulating layer 25, and a gate electrode 26 are arranged inside each gate trench 22.

Each bottom insulating layer 24 covers a bottom surface of its corresponding gate trench 22.

Each gate insulating layer 25 covers a side surface of its corresponding gate trench 22. Each gate insulating layer 25 is connected to its corresponding bottom insulating layer 24.

Each gate electrode 26 is arranged on its corresponding bottom insulating layer 24.

Each gate electrode 26 is insulated from the semiconductor substrate 12 by its corresponding gate insulating layer 25 and bottom insulating layer 24. An upper surface of each gate electrode 26 is covered by a corresponding interlayer insulating film 28.

As shown in FIGS. 1 to 3, the gate insulating layers 25 and the bottom insulating layers 24 are thicker within the peripheral portion 50b than in the center portion 50a. In the center portion 50a, both the gate insulating layers 25 and the bottom insulating layers 24 have a thickness d1. The gate insulating layers 25 and the bottom insulating layers 24 have a thickness d2 in the peripheral portion 50b. The thickness d2 is thicker than the thickness d1. More specifically, in the two gate trenches 22b that are arranged on the outermost sides (the gate trenches 22b having their entireties arranged in the peripheral portion 50b), entireties of the gate insulating layers 25 and the bottom insulating layers 24 have the thickness d2. In the gate trenches 22a, the gate insulating layers 25 and the bottom insulating layers 24 have the thickness d2 at the longitudinal end portions of the gate trenches 22a in the longitudinal direction (y direction), and the gate insulating layers 25 and the bottom insulating layers 24 have the thickness d1 at portions other than the longitudinal end portions.

Further, in the gate insulating layers 25 and the bottom insulating layers 24, portions having the thickness d1 and portions having the thickness d2 are constituted of materials different from each other. The portions having the thickness d1 (that is, the gate insulating layers 25 and the bottom insulating layers 24 within the center portion 50a) are constituted of an insulator having a dielectric constant $\varepsilon 1$ (which, in this embodiment, is silicon oxide (hereinbelow denoted as $SiO_2$)). The portions having the thickness d2 (that is, the gate insulating layers 25 and the bottom insulating layers 24 within the peripheral portion 50b) are constituted of an insulator having a dielectric constant $\varepsilon 2$ (which, in this embodiment, is an insulator in which nitrogen atoms are added to silicon oxide (hereinbelow denoted as SiON)). The dielectric constant $\varepsilon 2$ is larger than the dielectric constant $\varepsilon 1$. That is, in the peripheral portion 50b, the dielectric constants of the gate insulating layers 25 and the bottom insulating layers 24 are larger than those in the center portion 50a.

As shown in FIGS. 2 and 3, the upper surface 12a of the semiconductor substrate 12 is provided with an upper electrode 70. The upper electrode 70 is in contact with the upper surface 12a of the semiconductor substrate 12 at portions where the interlayer insulating films 28 are not provided. The upper electrode 70 is insulated from the gate electrodes 26 by the interlayer insulating films 28. A lower electrode 72 is provided on a lower surface 12b of the semiconductor substrate 12. The lower electrode 72 is in contact with the lower surface 12b of the semiconductor substrate 12.

As shown in FIGS. 1 to 3, a plurality of source regions 30, a body region 32, a drift region 34, and a drain region 35 are provided inside the semiconductor substrate 12.

Each of the source regions 30 is an n-type region. As shown in FIGS. 1 to 3, each source region 30 is provided at the upper surface 12a of the semiconductor substrate 12, and makes ohmic contact with the upper electrode 70. Further, each source region 30 is in contact with the gate insulating layer 25 at the side surface of its corresponding gate trench 22. Each source region 30 is in contact with the gate insulating layer 25 at an upper end portion of its corresponding gate trench 22.

The body region 32 is a p-type region. The body region 32 is in contact with the respective source regions 30. The body region 32 extends from each of ranges intervened between two adjacent source regions 30 downward to under the respective source regions 30. The body region 32 includes a low concentration region 32b and a plurality of high concentration regions 32a. Each of the high concentration regions 32a has a higher p-type impurity concentration than the low concentration region 32b. Each of the high concentration regions 32a is arranged in the range intervened between its two corresponding source regions 30. Each of the high concentration regions 32a is in ohmic contact with the upper electrode 70. The low concentration region 32b is arranged under the respective high concentration regions 32a and the respective source regions 30. The low concentration region 32b is in contact with the respective gate insulating layers 25 at the side surfaces of the gate trenches 22. The low concentration region 32b is in contact with each of the gate insulating layers 25 under the respective source regions 30. As shown in FIG. 1, the low concentration region 32b extends to outside the device region 50. Portions of the body region 32 located within ranges intervened between the gate trenches 22 are connected to each other on the outside of the device region 50. A lower end of the body region 32 (that is, a lower end of the low concentration region 32b) is arranged closer to the upper surface 12a than lower ends of the gate electrodes 26.

The drift region 34 is an n-type region. The drift region 34 is arranged under the body region 32, and is separated from the respective source regions 30 by the body region 32. The drift region 34 is in contact with the respective gate insulating layers 25 and the respective bottom insulating layers 24 at the side surfaces of the respective gate trenches 22. The drift region 34 is in contact with the respective gate insulating layers 25 and the respective bottom insulating layers 24 under the body region 32.

The drain region 35 is an n-type region. The drain region 35 has a higher n-type impurity concentration than the drift region 34. The drain region 35 is arranged under the drift region 34. The drain region 35 is located at the lower surface 12b of the semiconductor substrate 12. The drain region 35 is in ohmic contact with the lower electrode 72.

As shown in FIGS. 2 and 3, the gate electrodes 26 and the low concentration region 32b face each other via the gate insulating layers 25. Thus, a static capacitance exists between the gate electrodes 26 and the low concentration region 32b. The static capacitance per unit area at each portion where each gate electrode 26 and the low concentration region 32b face each other (hereinbelow referred simply as unit capacitance) is inversely proportional to the thickness of the corresponding gate insulating layer 25, and is proportional to the dielectric constant of the corresponding gate insulating layer 25. A larger unit capacitance allows a channel to be generated more easily in the low concentration region 32b when a potential of the gate electrode 26 is raised. Accordingly, a gate threshold (minimum gate potential required for channel generation) becomes lower with a larger unit capacitance. Further, a larger unit capacitance allows an on-resistance (resistance in a current path during when the MOSFET 10 is on) to become smaller. As aforementioned, in this embodiment, the portions of the gate insulating layers 25 having the thickness d1 (portions with thin thickness) have the dielectric constant $\varepsilon 1$ (small dielectric constant), and the portions of the gate insulating layers 25 having the thickness d2 (portions with thick thickness) have the dielectric constant $\varepsilon 2$ (large dielectric constant). Due to this, a difference in the unit capacitances is small between the portions having the thickness d1 and the portions having the thickness d2. Especially, in this embodiment, the thicknesses d1, d2 and the dielectric constants $\varepsilon 1$, $\varepsilon 2$ are set so that a ratio $d1/\varepsilon 1$ and a ratio $d2/\varepsilon 2$ become substantially equal. Due to this, the unit capacitances are substantially equal between the portions having the thickness d1 and the portions having the thickness d2. Accordingly, the gate thresholds and the on-resistances for the MOSFET are substantially equal between the portions having the thickness d1 and the portions having the thickness d2.

Next, an operation of the MOSFET 10 will be described. When the MOSFET 10 is to turn on, the potential of the gate electrodes 26 is raised. When the potential of the gate electrodes 26 exceeds the gate threshold, the channels are generated in the low concentration region 32b in the ranges adjoining the gate insulating layers 25, as a result of which current starts to flow in the MOSFET 10. As aforementioned, in the MOSFET 10 of the present embodiment, the unit capacitances between the gate electrodes 26 and the low concentration region 32b are substantially equal in the center portion 50a and the peripheral portion 50b, as a result of which the gate thresholds are substantially equal between the center portion 50a and the peripheral portion 50b. Due to this, when the potential of the gate electrodes 26 is to be raised, the channels are generated substantially concurrently in the center portion 50a as well as in the peripheral portion 50b, and the current starts to flow in the center portion 50a and the peripheral portion 50b substantially concurrently. If timings at which the channels are generated in the center portion 50a and in the peripheral portion 50b differ greatly, the current would flow temporarily with greater amount in one or the other of the center portion 50a and the peripheral portion 50b, which locally generates a high load. Contrary to this, in the MOSFET 10 of the present embodiment, an uneven flow of current caused by timing delays in the channel generation can be suppressed.

Further, as aforementioned, the MOSFET 10 of the present embodiment has substantially equal unit capacitances in the center portion 50a and in the peripheral portion 50b, as a result of which the on-resistances are substantially equal in the center portion 50a and in the peripheral portion 50b. Thus, in a state where the center portion 50a and the peripheral portion 50b are both on, the current flows substantially evenly in the center portion 50a and the peripheral portion 50b. If the on-resistances differ greatly between in the center portion 50a and in the peripheral portion 50b, the current would flow with greater amount in one or the other of the center portion 50a and the peripheral portion 50b, which locally generates a high load. Contrary to this, in the MOSFET 10 of the present embodiment, the uneven flow of current caused by the difference in the on-resistances can be suppressed.

When the potential of the gate electrodes 26 is thereafter reduced to below the gate threshold, the channels disappear, and the current stops. That is, the MOSFET 10 turns off. At this occasion, in the MOSFET 10 of the present embodiment, the channels disappear substantially concurrently in the center portion 50a and the peripheral portion 50b due to the substantially equal gate thresholds between the center portion 50a and the peripheral portion 50b. Due to this, in the MOSFET 10 of the present embodiment, the uneven flow of current caused by a delay in the timings when the channels disappear can be suppressed.

When the MOSFET 10 turns off, a depletion layer extends from the body region 32 to the drift region 34. When the drift region 34 is depleted, an electric field is generated across the drift region 34, the bottom insulating layers 24, and the gate insulating layers 25. At this occasion, the electric field is accumulated in the bottom insulating layers 24 and the gate insulating layers 25 in vicinities of the lower ends of the gate electrodes 26. Especially in the peripheral portion 50b, a degree of accumulation of the electric field becomes more intense than in the center portion 50a. That is, the bottom insulating layers 24 and the gate insulating layers 25 in the vicinities of the lower ends of the gate electrodes 26 in the peripheral portion 50b are most likely subjected to a high electric field. Contrary to this, in the MOSFET 10 of the present embodiment, the gate insulating layers 25 and the bottom insulating layers 24 in the peripheral portion 50$b$ have the thick thickness d2 and the large dielectric constant ε2. In the gate insulating layers 25 and the bottom insulating layers 24, the electric field is alleviated at a greater degree with a thicker insulating layer thickness, and also the electric field is alleviated at a greater degree with a larger dielectric constant. Due to this, in the MOSFET 10, the high electric field is suppressed from being generated in the gate insulating layers 25 and the bottom insulating layers 24 in the peripheral portion 50$b$. Accordingly, the MOSFET 10 has a high withstanding voltage.

Further, in the aforementioned embodiment, the gate insulating layers 25 in the peripheral portion 50$b$ are constituted of SiON. SiON has a higher linear expansion coefficient than $SiO_2$, so thermal stress within the semiconductor substrate 12 is more likely to be generated in vicinities of SiON. By using SiON only at limited portions of the gate insulating layers 25 as in the aforementioned embodiment, an influence of the thermal stress on the semiconductor substrate 12 brought about by SiON can be suppressed. It should be noted that $Al_2O_3$ or AlON may be used instead of SiON as an insulator with a high dielectric constant.

Next, a method of forming a gate structure of the MOSFET 10 will be described. In a case of constituting the gate insulating layers 25 in the peripheral portion 50$b$ with SiON, a method hereinbelow may be used. Firstly, the plurality of gate trenches 22 is formed. Then, $SiO_2$ (material for the bottom insulating layers 24 and the gate insulating layers 25) is deposited over entire inner surfaces of all the gate trenches 22. Next, the insides of the gate trenches 22 are filled fully with polysilicon (material for the gate electrodes 26). Then, the polysilicon in the peripheral portion 50$b$ is removed to expose the $SiO_2$ in the peripheral portion 50$b$. Then, $SiO_2$ is further deposited in the gate trenches 22 within the peripheral portion 50$b$ (that is, on surfaces of the exposed $SiO_2$ therein). Thereafter, nitrogen ions are implanted in the $SiO_2$ in the peripheral portion 50$b$. SiON is formed in the peripheral portion 50$b$ by these procedures. Next, the insides of the gate trenches 22 in the peripheral portion 50$b$ are filled fully with polysilicon (material for the gate electrodes 26). Thereafter, the upper surface of the semiconductor substrate 12 is planarized by CMP (Chemical Mechanical Polishing), and the gate structure (that is, the bottom insulating layers 24, the gate insulating layers 25, and the gate electrodes 26) shown in FIGS. 1 to 3 is thereby completed.

Figure 4:
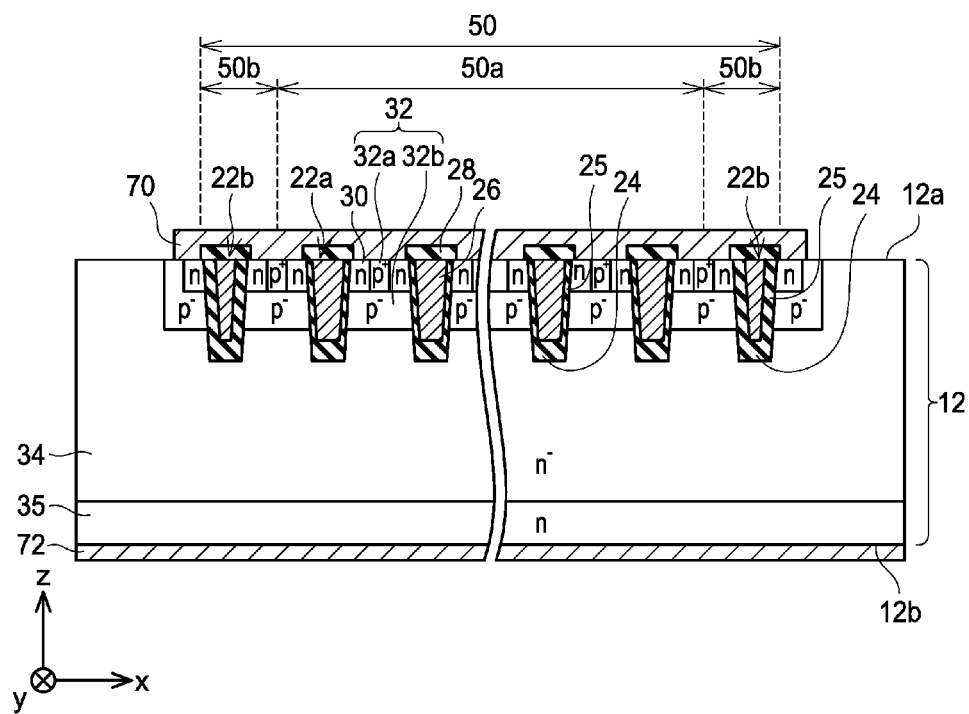
FIG. 4 is a cross sectional view of a MOSFET with thick bottom insulating layers.
Figure 5:
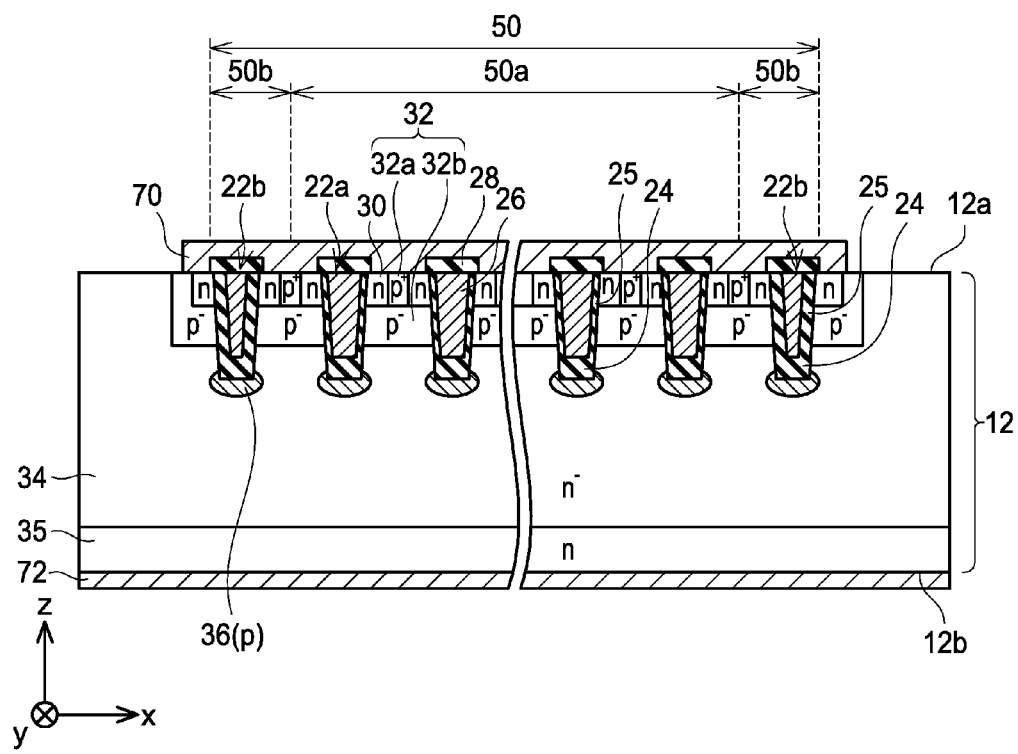
FIG. 5 is a cross sectional view of a MOSFET with bottom regions.

It should be noted, as shown in FIG. 4, a thickness of the bottom insulating layers 24 may be made much thicker than that of the gate insulating layers 25. Since the thickness of the bottom insulating layers 24 hardly affects the gate thresholds and the on-resistances, there is hardly any problem in thickening the thickness of the bottom insulating layers 24. As shown in FIG. 4, if the thickness of the bottom insulating layers 24 is to be made thick, the thickness of the bottom insulating layers 24 may be substantially same in the center portion 50$a$ and in the peripheral portion 50$b$, and a dielectric constant of the bottom insulating layers 24 may be equalized in the center portion 50$a$ and in the peripheral portion 50$b$. Further, as shown in FIG. 5, p-type bottom regions 36 may be provided to make contact with their corresponding bottom insulating layers 24 (more specifically, with the bottom surfaces of their corresponding gate trenches 22). A periphery of each bottom region 36 is surrounded by the drift region 34. The bottom regions 36 are separated from each other by the drift region 34. Each bottom region 36 may be separated from the body region 32 by the drift region 34, or may be connected to the body region 32 at a position that is not shown. According to the configuration of FIG. 5, a depletion layer extends from each bottom region 36 to the drift region 34 when the MOSFET turns off. The depletion layers extending from the respective bottom regions 36 can alleviate the electric field applied to the gate insulating layers 25. Due to this, the withstanding voltage of the MOSFET can further be improved.

Figure 6:
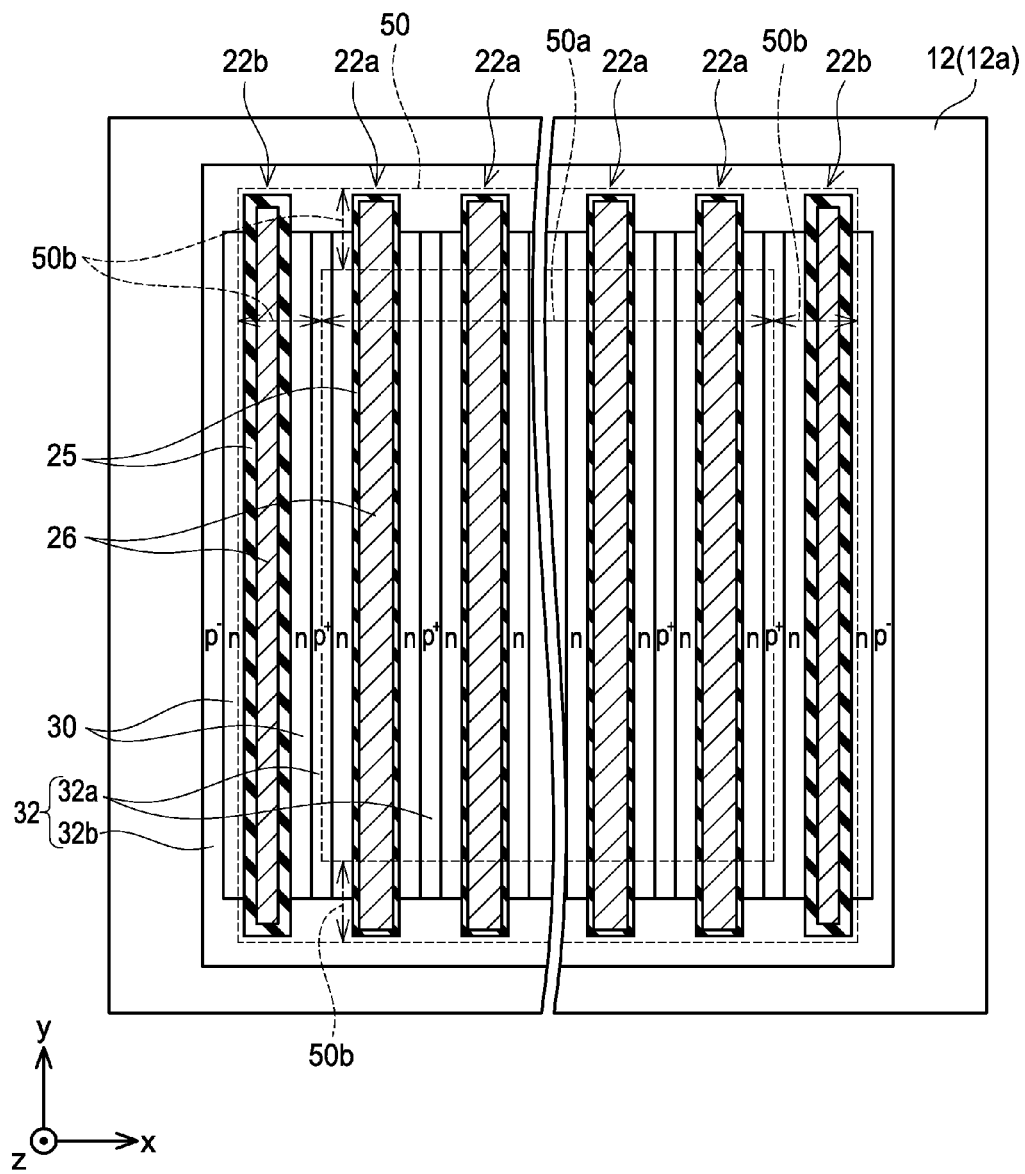
FIG. 6 is a plan view showing an example of a configuration with thick gate insulating layers provided at parts of a peripheral portion of a device region.
Figure 7:
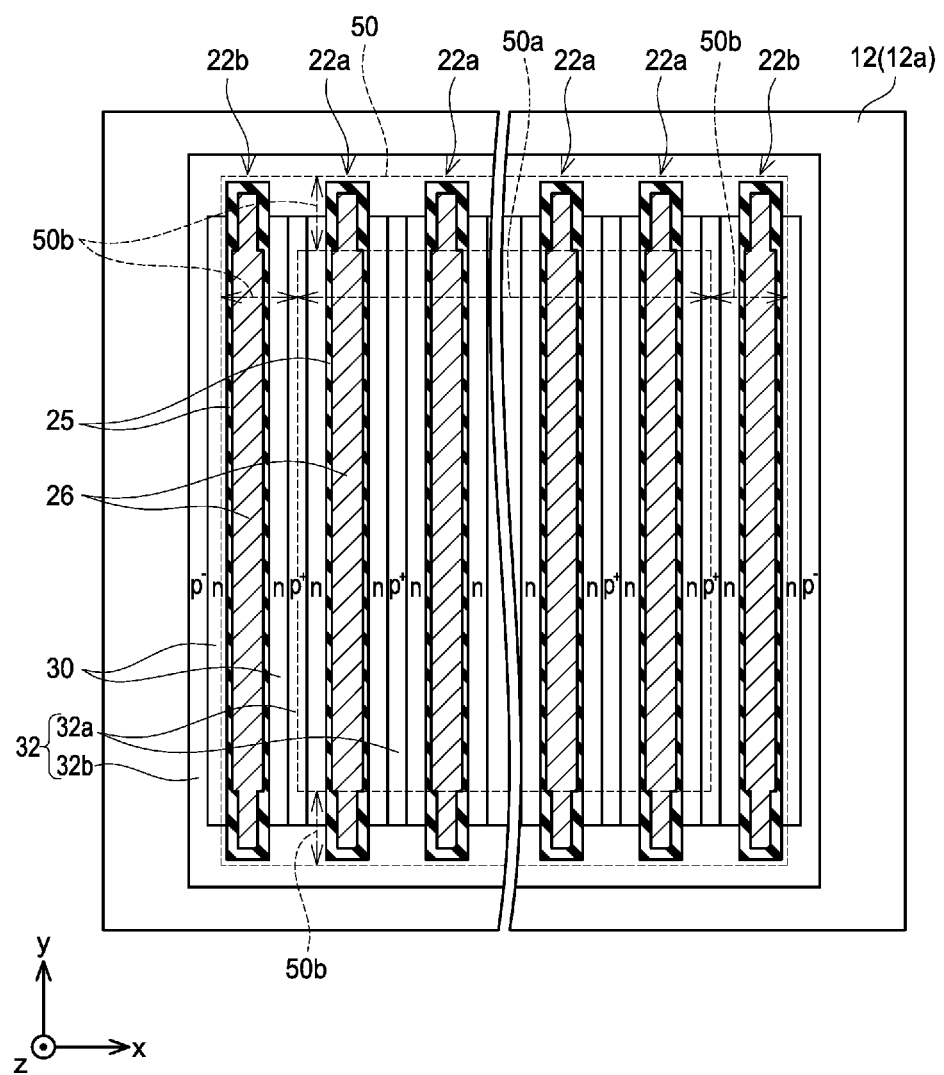
FIG. 7 is a plan view showing an example of a configuration with thick gate insulating layers provided at parts of the peripheral portion of the device region.

Further, in the aforementioned embodiment, the entireties of the gate insulating layers 25 in the peripheral portion 50$b$ have the thickness d2 and the dielectric constant ε2. Alternatively, as shown in FIGS. 6 and 7, the gate insulating layers 25 may selectively have the thickness d2 and the dielectric constant ε2 only partially in the peripheral portion 50$b$. In FIG. 6, while the gate insulating layers 25 have the thickness d1 and the dielectric constant ε1 over the entireties of the gate trenches 22$a$, the gate insulating layers 25 in the two gate trenches 22$b$ on the outermost sides have the thickness d2 and the dielectric constant ε2 over the entireties thereof. According to this configuration, the electric field accumulation in the gate insulating layers 25 at end portions of the device region 50 in the x direction can be suppressed. In FIG. 7, while the gate insulating layers 25 have the thickness d2 and the dielectric constant ε2 at their both longitudinal end portions in the longitudinal direction (y direction) in all of the gate trenches 22$a$ and 22$b$, the gate insulating layers 25 have the thickness d1 and the dielectric constant ε1 at their portions other than the longitudinal end portions in all of the gate trenches 22$a$ and 22$b$. According to this configuration, the electric field accumulation in the gate insulating layers 25 at end portions of the device region 50 in the y direction can be suppressed.

Figure 8:
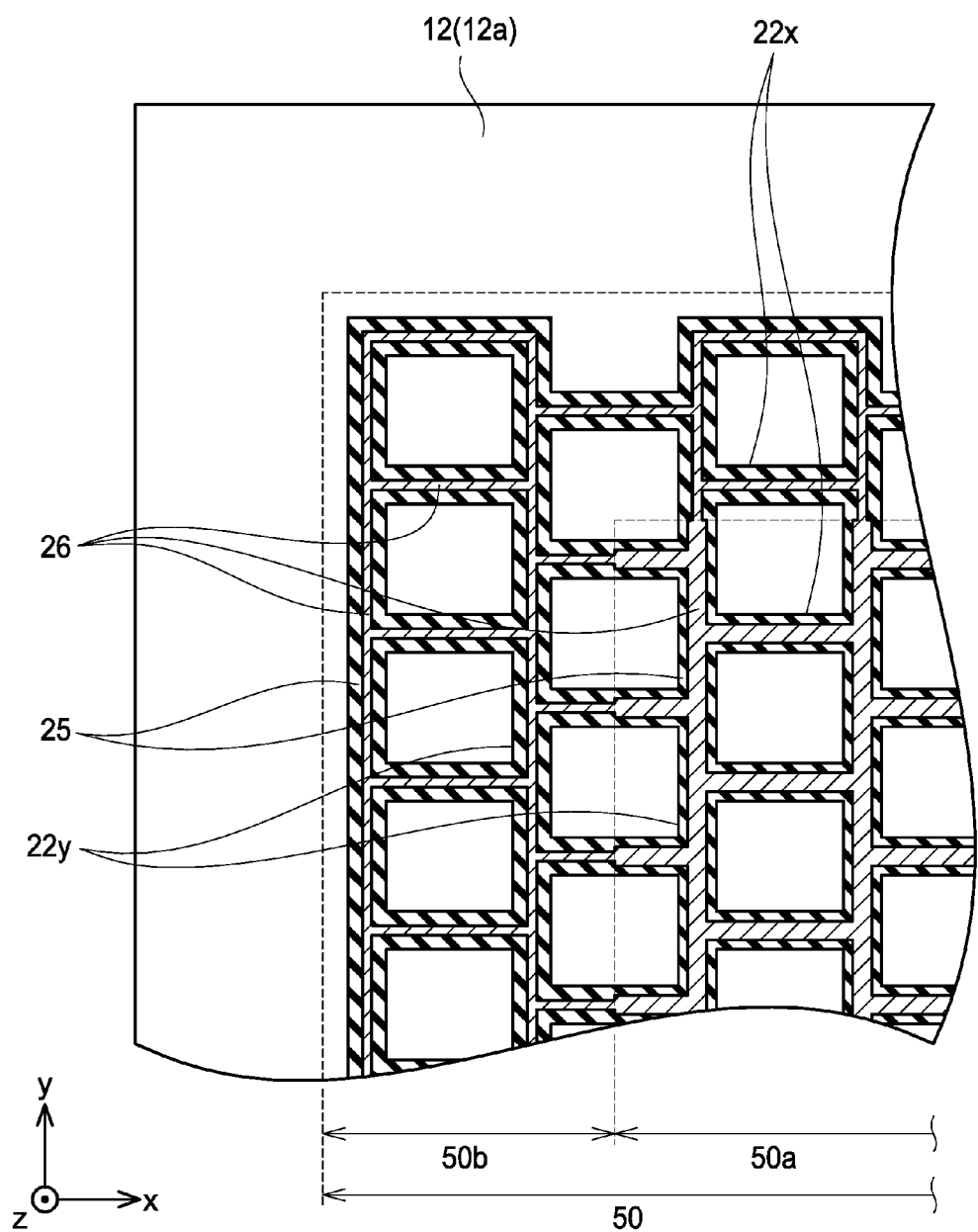
FIG. 8 is a plan view showing an example of a MOSFET having a trench matrix.

Further, in the aforementioned embodiments, all the gate trenches 22 extend linearly along the y direction. That is, the entirety of each of the gate trenches 22 is configured by a linear portion extending linearly in the y direction. Alternatively, as shown in FIG. 8, gate trenches 22$y$ extending linearly in the y direction may be connected to each other by gate trenches 22$x$ extending linearly in the x direction. In this case, a configuration may be employed in which the gate insulating layers 25 in the gate trenches 22$x$ are connected to the gate insulating layers 25 in the gate trenches 22$y$, the bottom insulating layers 24 in the gate trenches 22$x$ are connected to the bottom insulating layers 24 in the gate trenches 22$y$, and the gate electrodes 26 in the gate trenches 22$x$ are connected to the gate electrodes 26 in the gate trenches 22$y$. Further, although not shown, a source region and a body region may be provided in each of rectangular semiconductor regions surrounded by the gate trenches 22$x$ and 22$y$. In this configuration as well, same effects as those of the aforementioned embodiments can be achieved by making the thickness of the gate insulating layer 25 thicker and the dielectric constant of the gate insulating layer 25 greater in the peripheral portion 50$b$ than in the center portion 50$a$.

Further, in the aforementioned embodiments, the source regions 30 are provided for each gate trench 22. Alternatively, one source region 30 may be in contact with gate insulating layers 25 over the plurality of gate trenches 22.

Further, in the aforementioned embodiments, one body region 32 is in contact with the gate insulating layers 25 in the plurality of gate trenches 22. Alternatively, the body region 32 may be divided into a plurality. For example, in the configuration in FIG. 8 having the matrix gate trench, the body region 32 may be provided in each of the semiconductor regions surrounded by the gate trenches 22$x$ and 22$y$.

In this case, the body region 32 may be divided for each semiconductor region surrounded by the gate trenches 22x and 22y.

Figure 9:
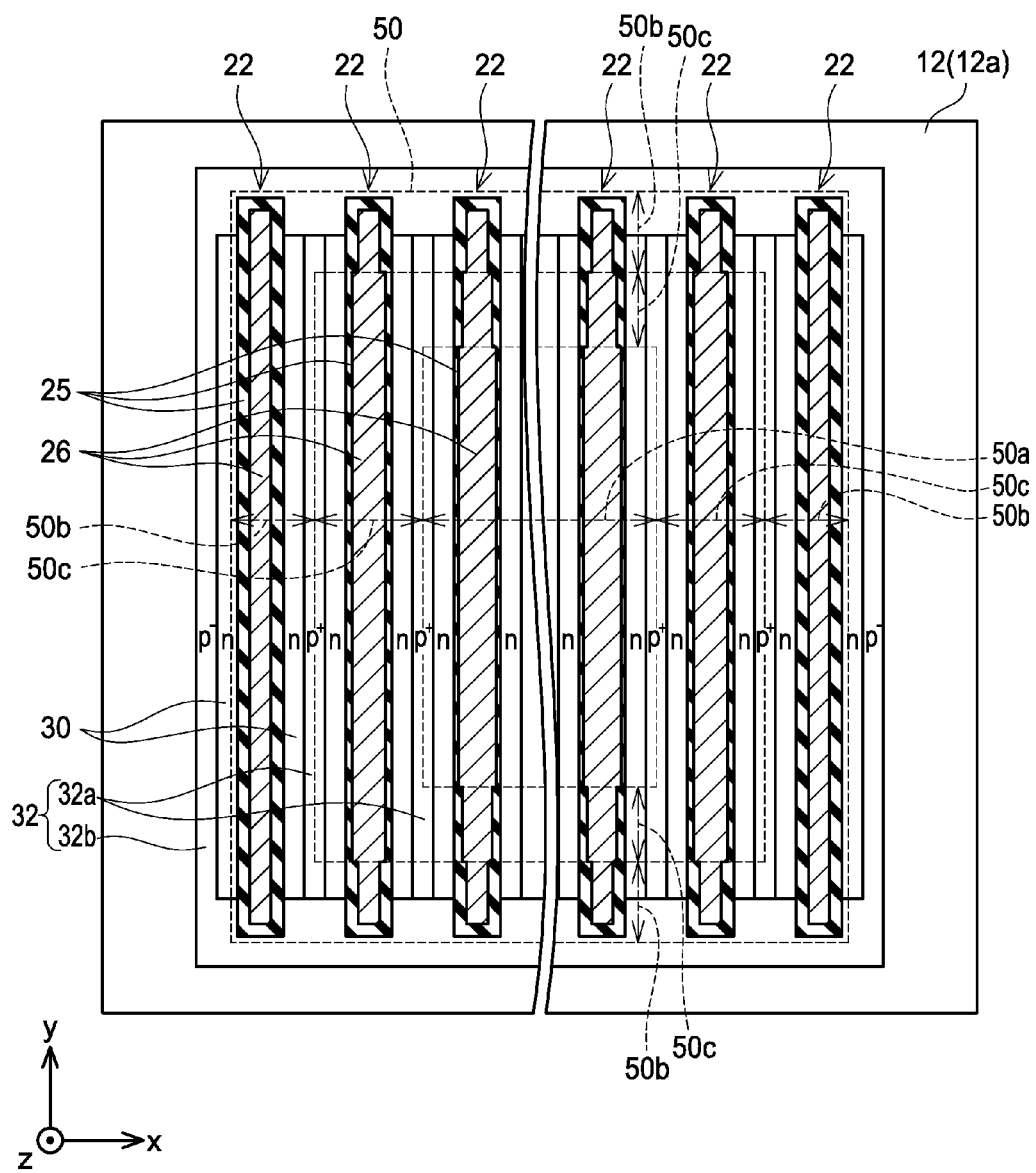
FIG. 9 is a plan view showing an example of a configuration in which gate insulating layer thicknesses gradually shift.

Further, as shown in FIG. 9, the device region 50 may include the center portion 50a, the peripheral portion 50b, and an intermediate portion 50c therebetween, and the thickness and the dielectric constant of the gate insulating layers 25 may differ for each of the center portion 50a, the intermediate portion 50c, and the peripheral portion 50b. In this case, the thicknesses of the gate insulating layers 25 in the center portion 50a, the intermediate portion 50c, and the peripheral portion 50b may be denoted as thicknesses d1, dc, d2, respectively, and the dielectric constants of the gate insulating layers 25 in the center portion 50a, the intermediate portion 50c, and the peripheral portion 50b may be denoted as $\epsilon 1$, $\epsilon c$, $\epsilon 2$, respectively, and relationships of $d1<dc<d2$ and $\epsilon 1<\epsilon c<\epsilon 2$ may be satisfied. That is, the thickness of the gate insulating layers 25 may gradually become thicker and the dielectric constant of the gate insulating layers 25 may gradually become larger from the center portion 50a (portion having the thickness d1) toward the peripheral portion 50b (portion having the thickness d2). According to this configuration, the electric field accumulation can further be suppressed in the device region 50, and characteristics (gate thresholds, on-resistances, and the like) of the respective regions may further be uniformized. Further, in FIG. 9, although the thickness and the dielectric constant of the gate insulating layers 25 shift in three levels, the thickness and the dielectric constant of the gate insulating layers 25 may shift in four or more levels.

Further, in the aforementioned embodiments, an n-channel type MOSFET is explained, however, techniques disclosed herein may be adapted to a p-channel type MOSFET. The p-channel type MOSFET can be achieved by inverting the n-type and the p-type of the respective regions in the MOSFET 10 of the embodiments. Further, the techniques disclosed herein may be adapted to an IGBT (Insulated Gate Bipolar Transistor). The IGBT can be achieved by providing a p-type collector region instead of the drain region 35 of the MOSFET 10 of the embodiments. Further, in the aforementioned embodiments, the semiconductor substrate 12 is constituted of SiC, however, the semiconductor substrate 12 may alternatively be constituted of other semiconductor material (such as other composite semiconductor material, or Si).

Relationships between constituent features of the aforementioned embodiments and constituent features of the claims will be described. The plurality of source regions 30 of the embodiments is an example of a first region of the claims. The drift region 34 of the embodiments is an example of a second region of the claims. The gate trenches 22a, 22b, 22x of the embodiments are examples of a linear portion of the claims. The gate trenches 22b of the embodiments are an example of two of the linear portions located on outermost sides of the claims.

Some of the features characteristic disclosed herein will be listed below. It should be noted that the respective technical elements are independent of one another, and are useful solely or in combinations.

In an exemplary switching device disclosed herein, each of the gate trenches may include a linear portion extending linearly along one direction. The linear portions may be arranged at intervals in a direction perpendicular to the one direction.

In the above-mentioned switching device including the linear portions, the gate insulating layers in two of the linear portions located on outermost sides may have the second thickness and the second dielectric constant over entireties of the two of the linear portions.

According to this configuration, the electric field accumulation in the two of the linear portions located on the outermost sides can be suppressed.

In the above-mentioned switching device including the linear portions, portions of the gate insulating layer that are located at longitudinal end portions of each of the linear portions in the one direction may have the second thickness and the second dielectric constant.

According to this configuration, the electric field accumulation in the longitudinal end portions of each of the linear portions can be suppressed.

In an exemplary switching device disclosed herein, a thickness of each gate insulating layer may increase gradually from a portion having the first thickness to a portion having the second thickness, and a dielectric constant of each gate insulating layer may increase gradually from the portion having the first thickness to the portion having the second thickness.

According to this configuration, the characteristics in the device region can further be uniformized.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:
1. A switching device, comprising:
a semiconductor substrate;
a plurality of gate trenches provided in an upper surface of the semiconductor substrate;
bottom insulating layers covering bottom surfaces of the gate trenches;
gate insulating layers covering side surfaces of the gate trenches; and
gate electrodes arranged in the gate trenches and insulated from the semiconductor substrate by the bottom insulating layers and the gate insulating layers,
wherein
a device region is a region in the upper surface in which the plurality of gate trenches is provided,
the device region includes a peripheral portion provided at a periphery of the device region and a center portion surrounded by the peripheral portion, the gate insulating layers being located in the peripheral portion and the center portion,
the gate insulating layers in the center portion have a first thickness and a first dielectric constant,
one or more of the gate insulating layers in the peripheral portion has, within at least a part of the peripheral portion, a second thickness thicker than the first thickness and a second dielectric constant greater than the first dielectric constant, and
the semiconductor substrate comprises:
a first region being of a first conductivity type and in contact with the gate insulating layers in the center portion and the peripheral portion;

a body region being of a second conductivity type and in contact with the gate insulating layers under the first region in the center portion and the peripheral portion; and a second region being of the first conductivity type and in contact with the gate insulating layers under the body region in the center portion and the peripheral portion.

2. The switching device of claim 1, wherein
each of the gate trenches includes a linear portion extending linearly along one direction, and
the linear portions are arranged at intervals in a direction perpendicular to the one direction.

3. The switching device of claim 2, wherein the gate insulating layers in two of the linear portions located on outermost sides of the device region have the second thickness and the second dielectric constant over entireties of the two of the linear portions.

4. The switching device of claim 2, wherein portions of the gate insulating layers that are located at longitudinal end portions of each of the linear portions in the one direction have the second thickness and the second dielectric constant.

5. The switching device of claim 1, wherein
a thickness of each gate insulating layer increases gradually from a portion having the first thickness to a portion having the second thickness, and
a dielectric constant of each gate insulating layer increases gradually from the portion having the first thickness to the portion having the second thickness.

* * * * *